United States Patent [19]
Saito et al.

[11] Patent Number: 5,757,043
[45] Date of Patent: May 26, 1998

[54] CHARGE PUMP SEMICONDUCTOR DEVICE

[75] Inventors: Naoto Saito; Shinichi Yoshida, both of Chiba, Japan

[73] Assignee: Seiko Instruments Inc., Japan

[21] Appl. No.: 691,870

[22] Filed: Aug. 2, 1996

[30] Foreign Application Priority Data

Aug. 3, 1995 [JP] Japan ............ 7-198805
Jul. 31, 1996 [JP] Japan ............ 8-202313

[51] Int. Cl.$^6$ .................................. H01L 29/78
[52] U.S. Cl. ................ 257/299; 257/401; 363/60
[58] Field of Search ................ 257/299, 403, 257/401; 327/537; 363/59, 60

[56] References Cited

U.S. PATENT DOCUMENTS

4,684,967  8/1987  Taylor, Sr. et al. ............ 257/372
4,878,120  10/1989  Matsumoto et al. ............ 257/225
4,969,023  11/1990  Svedberg ............ 257/347

Primary Examiner—Tom Thomas
Assistant Examiner—David B. Hardy
Attorney, Agent, or Firm—Adams & Wilks

[57] ABSTRACT

A channel region is enclosed by a source region or drain region. A plurality of the resulting MOS transistors are diode connected in series to each other. The MOS transistors are formed in the well regions. As a result of this, it is possible to prevent breakdown at a time when a substrate bias is being applied and a resulting change in the threshold value due to the substrate bias effect.

12 Claims, 6 Drawing Sheets

STAGE NUMBER OF MOS TRANSISTOR 5,757,043

CHARGE PUMP SEMICONDUCTOR DEVICE

BACKGROUND OF THE INVENTION

1. Field of the Invention

The present invention relates to a construction of a MOS type semiconductor integrated circuit device and more particularly to a construction of a semiconductor integrated circuit device having a step-up circuit (hereinafter referred to also as "a charge pump circuit").

2. Description of the Related Art

A step-up circuit is indispensable, for example, when a storage device needs a high write-in voltage. This circuit performs boosting of a voltage from a power sorce voltage of 1 volt or so up to a voltage of several volts. However, conventionally, various adverse effects that are attributable to the back gate bias effect appear in MOS transistors that constitute a step-up circuit. Examples of such adverse effects are a rise in the threshold voltage, an abnormal decrease in the withstand voltage, etc. As a result of this, an increased number of MOS transistor stages are, for example, needed. For this reason, it is difficult to cause an increase in the efficiency and performance of the circuit.

Figure 2A:
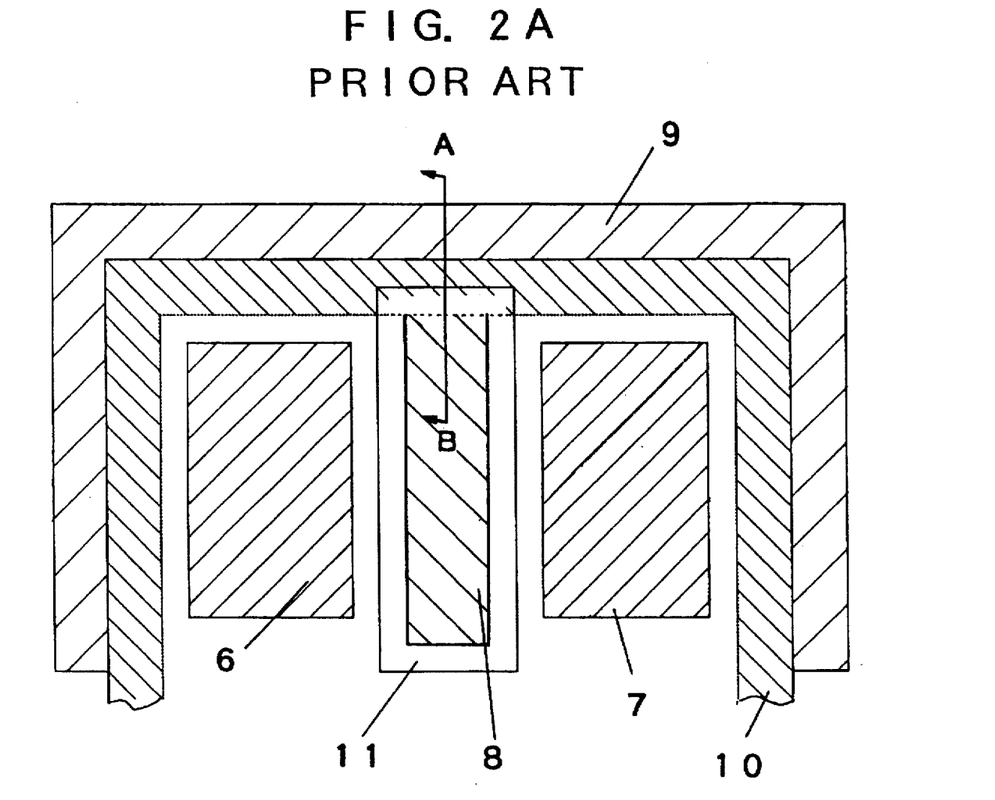
FIG. 2A is a typical plan view illustrating the dispositions of respective regions of a conventional MOS transistor while, on the other hand.
Figure 2B:
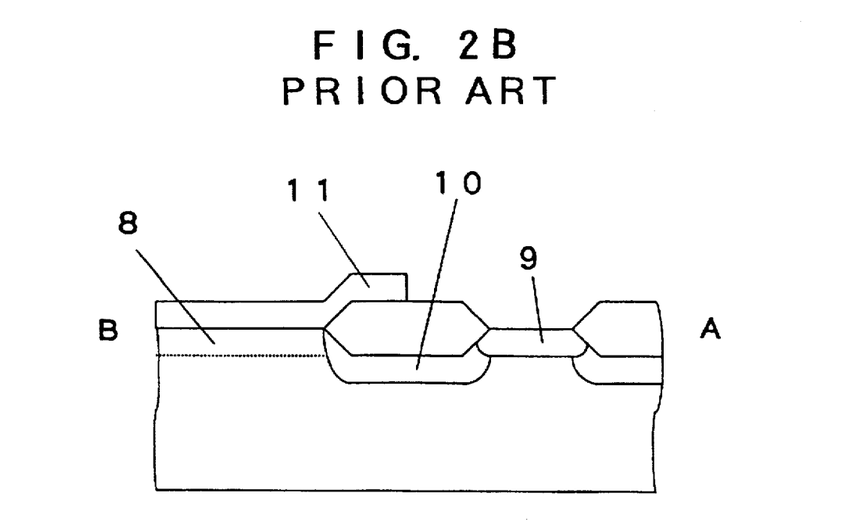
FIG. 2B is a typical sectional view illustrating a zone from the channel region to the field dope region of the conventional MOS transistor.

FIG. 2A is a typical plan view illustrating the dispositions of respective regions of a conventional MOS transistor. FIG. 2B is a typical sectional view taken along the line A–B of the conventional transistor illustrated in FIG. 2A. Here, firstly, the mechanism of the breakdown between a channel region 8 and a substrate potential region 10 (field dope region) will be explained (the explanation will be given as that when the element is an N-channel MOS transistor).

In the conventional disposition as illustrated in FIGS. 2A and 2B, (1) when the MOS transistor is in an "on" state, since electrons are induced to occur in the channel, it is considered that the channel region 8 is an N-type high concentration region, (2) a boron field dope region 10 exists close to the channel region and the potential there is approximate to the potential of the substrate, (3) between the channel and boron field dope regions there is applied a voltage that corresponds to a difference between the substrate potential and the source potential, and (4) when the voltage that corresponds to a difference between the substrate potential and the source potential becomes high, breakdown occurs between the channel and boron field dope regions, provided, however, that the state that is considered to be under the item (1) above is not limited to being so only when electrons are induced to occur in the channel. Since a depletion layer cannot be spread right beneath the gate insulation film to both sides thereof unlike the junction, it is considered that the voltage that corresponds to a difference between the substrate potential and the source potential is directly applied there. Accordingly, applying a positive voltage to the gate electrode 11 has a meaning of this phenomenon being furthered.

Accordingly, in a conventional disposition such as that illustrated in FIG. 2A, even when the distance between each of the source and drain regions 6, 7 and the field dope region 10 is set to be appropriate by taking the withstand voltage therebetween into consideration, since the channel region 8 and field dope region 10 are close to each other as illustrated in FIG. 2B (if they are made to be spaced away from each other, it will be likely that a portion therebetween may unpreferably become a leakage current path between the source region 6 and drain region 7), the following inconvenience has sometimes occurred. Namely, in a device in which a substrate bias is applied, there has sometimes occurred the phenomenon that when the gate voltage has increased, the withstand voltage has rapidly decreased.

In each MOS transistor of a conventional step-up circuit that is constituted by a plurality of MOS transistors that are connected in series to each other, the threshold voltage value rises due to the substrate bias effect, with the result that a decrease in the voltage increase efficiency occurs. For this reason, the efficiency of the step-up circuit was deteriorated very much. Also, since as the desired voltage became higher the amplification of this effect and the specific occurrence of the breakdown at the time of application of the substrate bias had to be taken into consideration, it was impossible to construct a step-up circuit device that was high in performance and efficiency, low in cost and easy to design.

SUMMARY OF THE INVENTION

The present invention has been made in order to solve the above-mentioned problems of the prior art, and an object of the present invention is to prevent a rise in the threshold value voltage and a resulting decrease in the withstand voltage of a step-up circuit that uses MOS transistors.

In order to attain the above object, the following measures have been taken in the present invention.

As a first measure, in order to cause the distance between the channel region and the field dope region to be spaced away from each other by at least a certain distance, a measure has been taken of enclosing the entire channel region totally by the source region or drain region. As a result of this, it is possible to prevent deterioration in the withstand voltage of the MOS transistor when the substrate bias is being applied.

Further, by forming every angular portion of impurity ion implantation regions when impurity regions such as source or drain are formed at an obtuse angle, voltage breakdown may be prevented that is attributable to the concentration of an electric field that is applied between the source or drain region and the substrate potential region (the field dope region and the high concentration region in which to form the substrate electrode).

As a second measure, a measure has been taken of constructing a step-up circuit (charge pump circuit) wherein a plurality of MOS transistors are diode connected in series to each other and a capacitor for accumulation of charges is connected to each transistor and constructing all, or several, or particularly ending ones, of the MOS transistors therein such that the entire channel region as described in the first measure is enclosed totally by the source or drain region.

As a third measure, a measure has been taken of constructing a step-up circuit (charge pump circuit) wherein a plurality of MOS transistors are diode connected in series to each other and a capacitor for accumulation of charges is connected to each transistor and forming all, or several ones, of the MOS transistors in the well region and making the potential of this well region the same as that of the source region of the MOS transistor.

By taking the above-mentioned measures, the following effects are obtained.

By taking the first measure, it is possible to realize a device of a high withstand voltage without causing a decrease in the withstand voltage of each relevant element.

By taking the second measure, since in the step-up circuit the withstand voltage of the MOS transistor is not deteriorated, in the resulting device it becomes possible to step the voltage up to a desired level.

By taking the third measure, deterioration in the voltage increase efficiency does not occur, with the result that the step-up circuit has a very high in the efficiency, which results in the need for a smaller number of MOS transistors and, even when the MOS transistor stages are same in number, the increase in voltage can be made up to a higher level. Further, because no deterioration occurs in the voltage increase efficiency, the device becomes easy to design.

DETAILED DESCRIPTION OF THE PREFERRED EMBODIMENTS

Preferred embodiments of the present invention will now be described with reference to the drawings.

Figure 1:
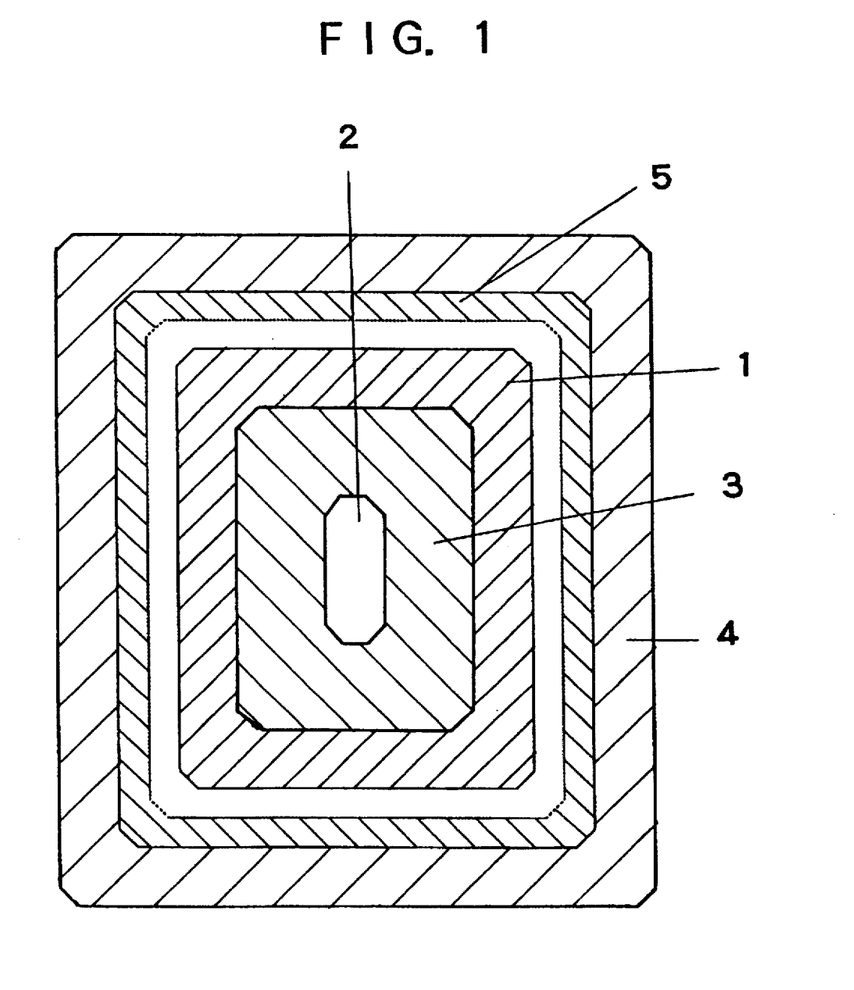
FIG. 1 is a typical plan view illustrating the dispositions of respective regions of a MOS transistor in accordance a first embodiment of the present invention.

FIG. 1 is a typical plan view illustrating the layout of respective regions of a MOS transistor in a first embodiment of the present invention.

(First Embodiment)

In FIG. 1 which illustrates a first embodiment of the present invention, a source region 1 is formed in such a manner as to enclose a drain region 2 and further a substrate electrode 4 is disposed in such a manner as to enclose the source region 1. The position of the drain region 2 and that of the source region 1 may be interchanged with each other. By such dispositions of the respective regions, it is possible to automatically cause the channel region 3 and the field dope region 5 whose potential is close to that of the substrate to be spaced by a longer distance from each other. In addition, if the distance between the source or drain region and the field dope region 5 is optimized by such construction, it is possible to prevent the withstand voltage of the element per se from being determined by a withstand voltage that corresponds to the junction breakdown that occurs between the channel region 3 and the field dope region 5. In addition, the angular portions of the ion implantation regions when impurity regions such as source or drain are formed are constructed using curvilinear or obtuse configurations. Thus, breakdown can be prevented that is attributable to the concentration of an electric field that is applied between the source or drain region and the substrate potential region (the field dope region and the high concentration region in which to form the substrate electrode).

(Second Embodiment)

Figure 3:
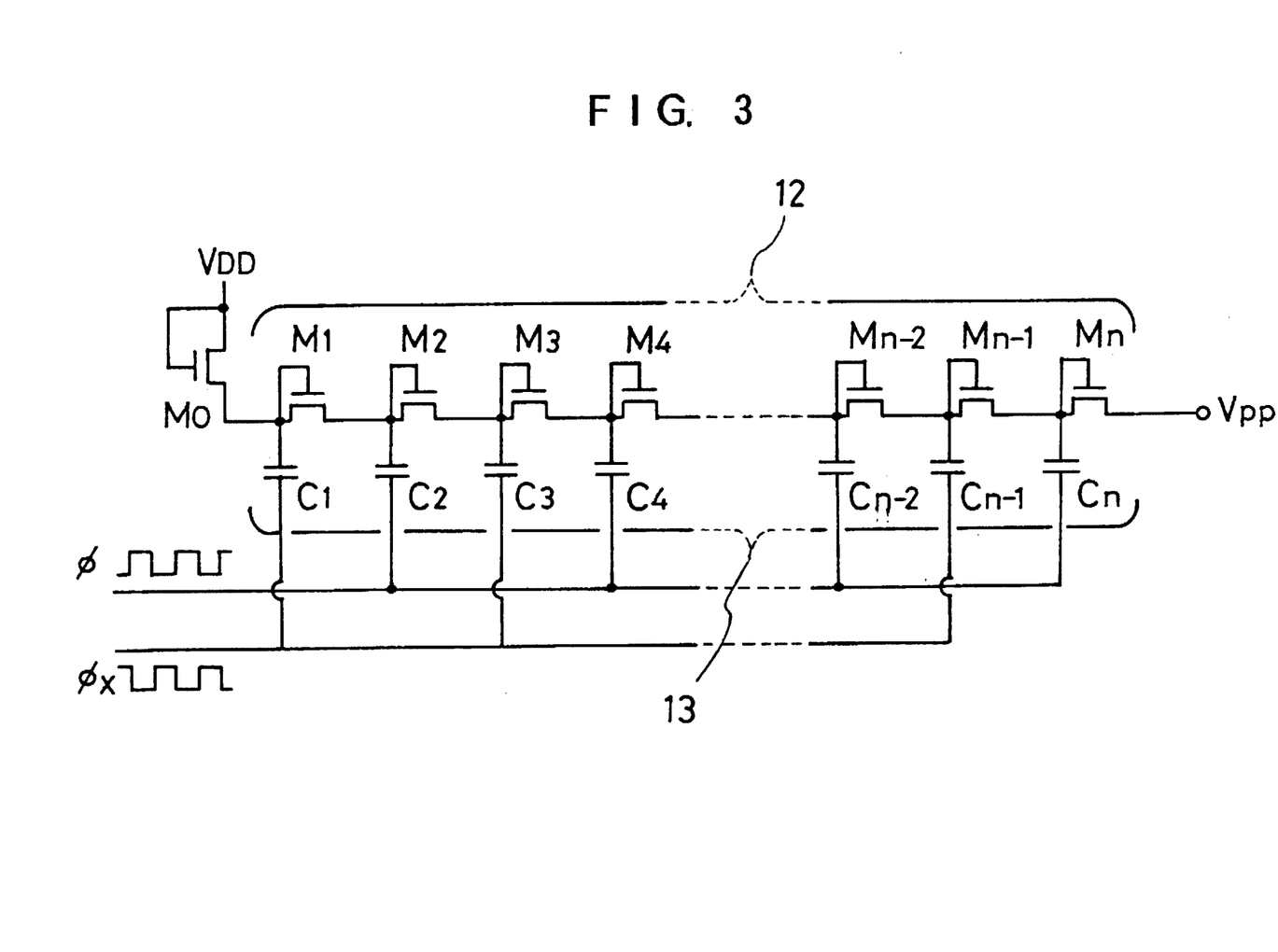
FIG. 3 is a circuit diagram illustrating a step-up circuit device according to a second embodiment of the present invention.
Figure 4:
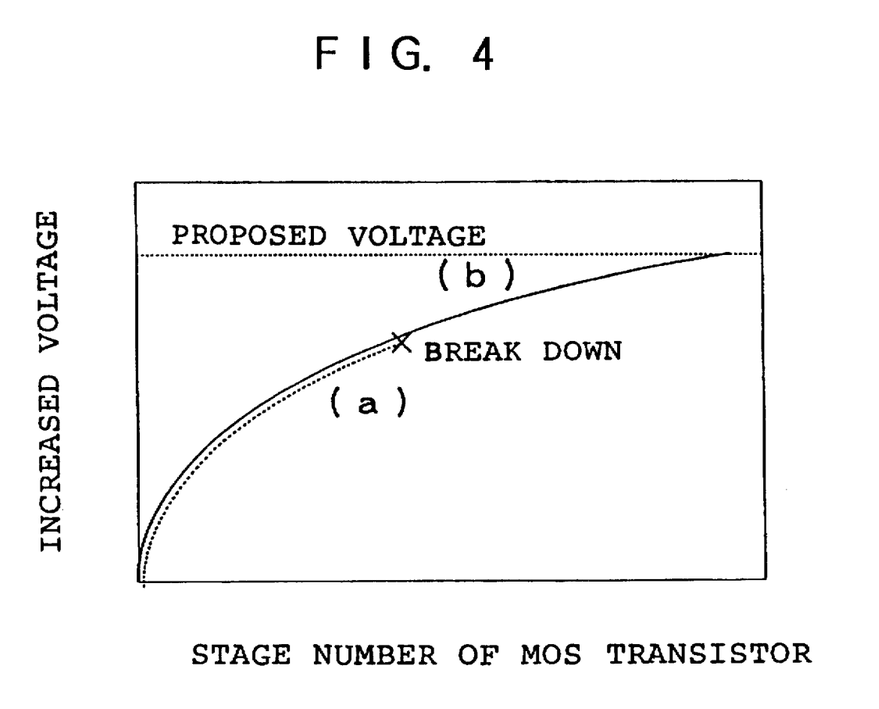
FIG. 4 is a graphic diagram illustrating the number of MOS transistors in stages in the second embodiment of the present invention.

FIG. 3 is a circuit diagram illustrating a step-up circuit (charge pump circuit) according to a second embodiment of the present invention. Also, FIG. 4 is a graphic diagram illustrating the relationships between the number of stages constituting the step-up circuit (charge pump circuit) according to the second embodiment of the present invention and its relevant increased voltage and between the number of the MOS transistors in stages which constitute a conventional step-up circuit and its relevant increased voltage.

A plurality of MOS diodes 12 in each of which the drain and gate electrodes of the MOS transistor are connected to each other by the same node are connected in series to each other and a capacitor 13 is connected to each of the nodes by means of which the mating MOS diodes are connected to each other. The circuit is constructed such that signals $\Phi$ and $\Phi x$ whose phases are shifted from each other are each alternately applied to one electrode of each respective capacitor, whereby, by electric charges being sequentially transferred from the capacitor C1 to the capacitor Cn, a high voltage $V_{PP}$ that has been raised from a power source voltage $V_{DD}$ is output from the MOS diode Mn.

At this time, if the MOS diodes M1 to Mn are each constructed using the conventional MOS transistor, a successively higher substrate bias is applied to the sequential a MOS transistor stages. Therefore, breakdown occurs between the channel region and the boron field dope region, with the result that it is impossible to raise the voltage up to a high level. Accordingly, the relationship between the stages number and the increased voltage is as illustrated in FIG. 4(a).

For this reason, in this embodiment, in all, or selected ones, succeeding more in the part wherein a high voltage is applied, of the MOS diodes M1 to Mn, the source region is formed in such a manner as to enclose the drain region and further the substrate electrode is disposed in such a manner as to enclose the source region.

(Third Embodiment)

Figure 5:
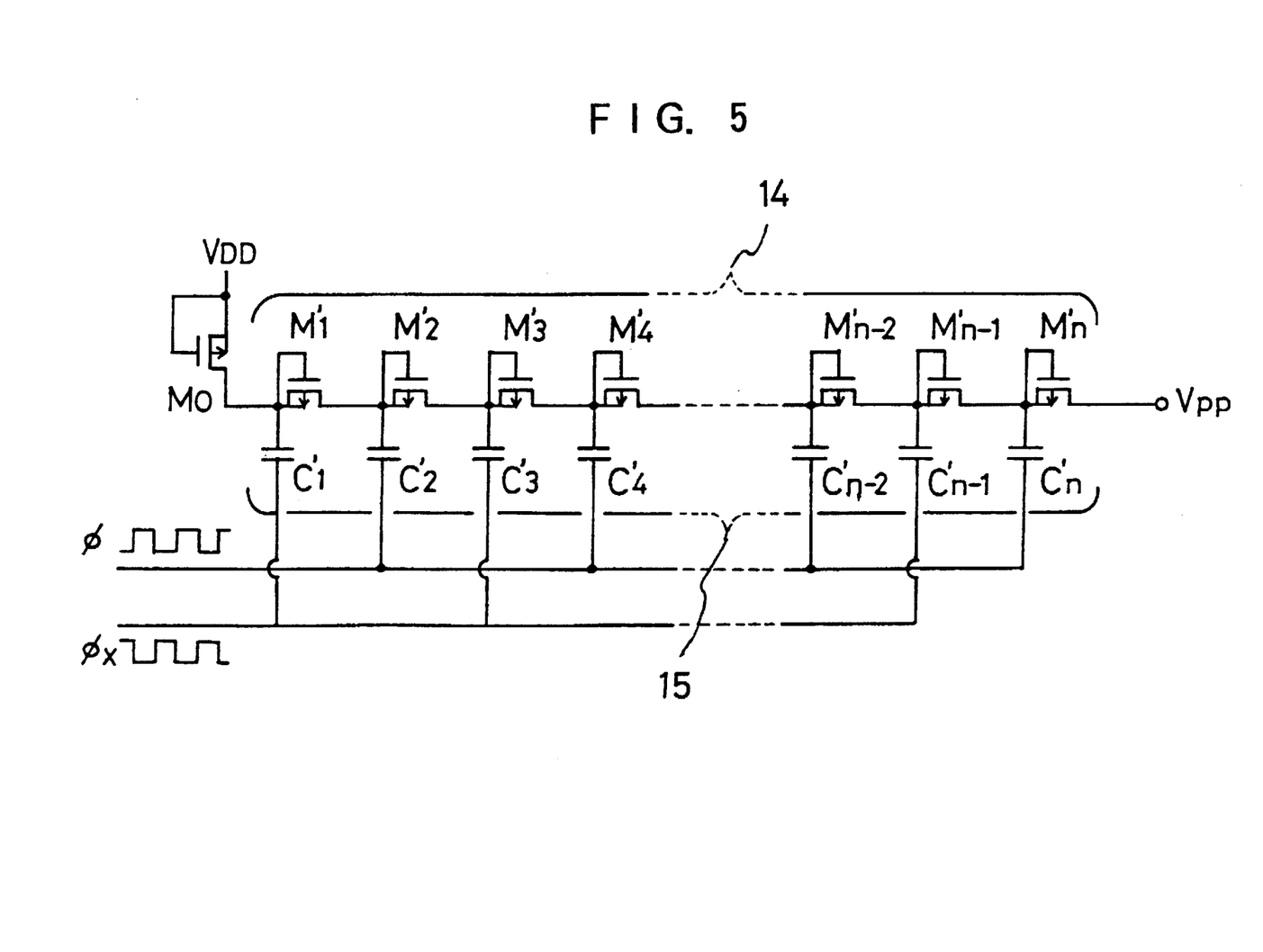
FIG. 5 is a circuit diagram illustrating a step-up circuit device according to a third embodiment of the present invention.
Figure 6:
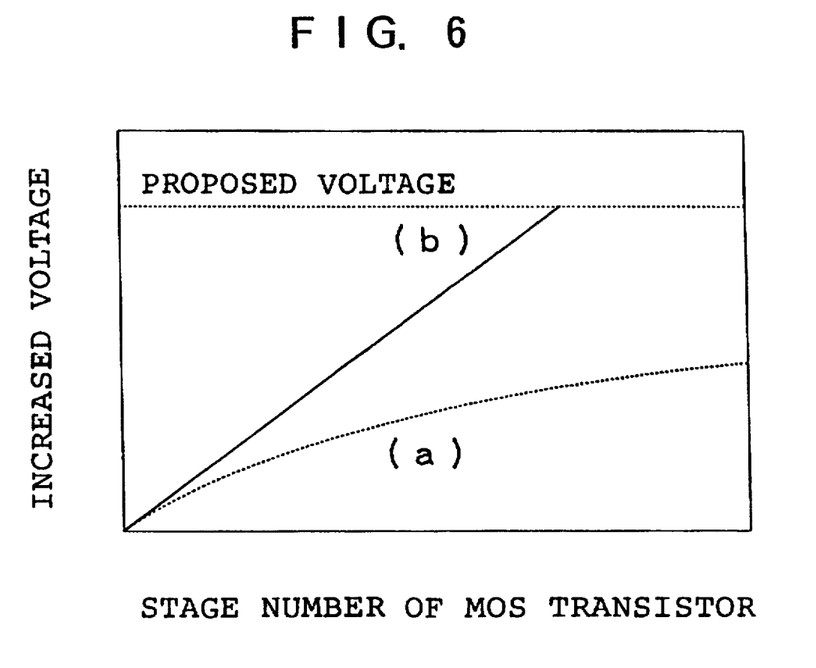
FIG. 6 is a graphic diagram illustrating the number of MOS transistors in stages in the third embodiment of the present invention.

FIG. 5 is a circuit diagram illustrating a step-up circuit (charge pump circuit) according to a third embodiment of the present invention. Also, FIG. 6 is a graphic diagram illustrating the relationships between the number of stages in the step-up circuit according to the third embodiment and its relevant increased voltage and the number of the MOS transistors in stages that constitute the conventional step-up circuit and its relevant increased voltage.

A plurality of MOS diodes 14 in each of which the drain and gate electrodes of the MOS transistor are connected to each other by the same node are connected in series to each other and a capacitor 15 is connected to each of the nodes by means of which the mating MOS diodes are connected to each other. The circuit is constructed such that signals $\Phi$ and $\Phi x$ whose phases are shifted from each other are each alternately applied to one electrode of each capacitor, whereby, by electric charges being sequentially transferred from the capacitor C1 to the capacitor Cn, a high voltage $V_{PP}$ that has been raised from a power source voltage $V_{DD}$ is output from the MOS diode Mn.

At this time, if the MOS diodes M1 to Mn are each constructed of a MOS transistor that has been directly formed in the substrate, the threshold value substantially increases due to the substrate bias effect in succeeding MOS transistor stages, with the result that the decrease in the source voltage as viewed relative to the drain voltage becomes gradually larger. Namely, the efficiency of the charge pump circuit constituting the step-up circuit becomes more deteriorated in a succeeding stages therein. Accordingly, the relationship between the stages number and its relevant increased voltage is as illustrated (a) in FIG. 6.

As a countermeasure against this, in this embodiment, by forming each of part, or all, of the MOS diodes Ml to Mn in one well region the and making the potential of this well region same as that of the source region of the MOS transistor, the circuit is constructed such that the threshold value is prevented from being adversely affected by the substrate bias effect. By such a construction, the relationship between the number of stages and its relevant increased voltage is as illustrated (b) in FIG. 6.

The present invention enables realization of a step-up circuit device in which the number of stages is decreased, the performance is increased and the cost is reduced, by eliminating the possibility that there may occur a decrease in the withstand voltage and a resulting increase in the threshold value voltage in the step-up circuit.

What is claimed is:

1. A semiconductor device having a plurality of MOS transistors, each MOS transistor comprising: a semiconductor substrate; a source region formed in the semiconductor substrate; a drain region formed in the semiconductor substrate; a channel region formed in the semiconductor substrate between the source and drain regions; a gate insulation film formed on the channel region; a gate electrode formed on the gate insulation film; and a substrate electrode disposed over a region of the semiconductor substrate for applying a voltage to the substrate; wherein the channel region is enclosed by one of the source region and the drain region, and a plurality of the MOS transistors are configured as diodes and are connected in series to each other.

2. A semiconductor device as set forth in claim 1; wherein the plurality of MOS transistors are configured as a step-up circuit having at least a first MOS transistor and a second MOS transistor, the drain region and gate region of the first MOS transistor are electrically connected at a first node, the drain region and gate region of the second MOS transistor are electrically connected at a second node, the source region of the first MOS transistor is electrically connected at the second node, such that a first pulse signal may be applied through a capacitor to the first node and a second pulse signal having a phase different from that of the first pulse signal may be applied through a capacitor to the second node so that an input voltage applied to the first node is output as a stepped-up output voltage from the source region of the second MOS transistor.

3. A semiconductor device as set forth in claim 1; wherein the plurality of MOS transistors are configured as a step-up circuit having at least a first MOS transistor and a second MOS transistor, the source region of the first MOS transistor is electrically connected at a first node, the drain region and gate region of the first MOS transistor are electrically connected at a second node, the source region of the second MOS transistor is electrically connected at the second node, the drain region and gate electrode of the second MOS transistor are electrically connected to a third node, such that a first pulse signal may be applied through a capacitor to the first node and a second pulse signal having a phase different from that of the first pulse signal may be applied through a capacitor to the second node, so that an input voltage applied to the source region of the first MOS transistor is output as a stepped-up voltage from the drain region of the second MOS transistor.

4. A semiconductor device as set forth in claim 3; wherein the first MOS transistor is formed in a first well region formed in the semiconductor substrate, the first well region having a conductivity type different from that of a surrounding portion of the semiconductor substrate, and the second MOS transistor is formed in a second well region formed in the semiconductor substrate, the second well region having a conductivity type different from that of a surrounding portion of the semiconductor substrate, such that the source region of the first MOS transistor formed in the first well region is substantially same in potential as the first well region and the source region of the second MOS transistor formed in the second well region is substantially the same in potential as the second well region.

5. A semiconductor device as set forth in claim 1; wherein the plurality of MOS transistors each has the drain region and the gate electrode thereof short-circuited.

6. A semiconductor device having one or more MOS transistors, each MOS transistor comprising: a semiconductor substrate; a source region formed in the semiconductor substrate; a drain region formed in the semiconductor substrate; a channel region formed in the semiconductor substrate between the source and drain regions; a gate insulation film formed on the channel region; a gate electrode formed on the gate insulation film; and a substrate electrode disposed over a region of the semiconductor substrate for applying a voltage to the substrate; wherein the channel region is enclosed by one of the source region and the drain region, and the channel region, the substrate electrode, the source region and the drain region are all concentrically aligned.

7. A semiconductor device as set forth in claim 6; wherein the channel region, the source region, and the drain region are each formed with curvilinear boundaries to prevent undesired charge build-up.

8. A MOS transistor comprising: a semiconductor substrate; a source region formed in the semiconductor substrate; a drain region formed in the semiconductor substrate; a channel region formed in the semiconductor substrate between the source and drain regions; a gate insulation film formed on the channel region; a gate electrode formed on the gate insulation film; and a substrate electrode formed on a region of the substrate for applying a voltage to the substrate; wherein the substrate electrode, the channel region, the source region and the drain region are concentrically aligned such that the channel region and one of the source and drain regions are surrounded by the other one of the source and drain regions.

9. A MOS transistor according to claim 8; wherein the channel region, the source region, and the drain region are each formed with curvilinear boundaries to prevent undesired charge build-up.

10. A charge pump device comprising: a plurality of MOS transistors connected in series to each other; a capacitor connected to each of the MOS transistors; an input terminal connected to a respective MOS transistor for receiving an input voltage; and an output terminal connected to another respective MOS transistor for outputting a stepped-up voltage; wherein at least one of the MOS transistors comprises a semiconductor substrate, a source region formed in the semiconductor substrate, a drain region formed in the semiconductor substrate, a channel region formed in the semiconductor substrate between the source and drain regions, a gate insulation film formed on the channel region, a gate electrode formed on the gate insulation film, and a substrate electrode formed on a region of the substrate for applying a voltage to the substrate; wherein the channel region, the source region and the drain region are concentrically aligned such that the channel region and one of the source and drain regions are surrounded by the other one of the source and drain regions.

11. A charge pump circuit according to claim 10; wherein the plurality of MOS transistors comprises at least one first MOS transistor and at least one second MOS transistor, the drain region and gate region of each first MOS transistors are electrically connected to a first node, the drain region and gate region of each second MOS transistor are electrically connected to a second node, and the source region of each first MOS transistor is electrically connected to the second node, such that a first pulse signal may be applied through a capacitor to the first node and a second pulse signal having a phase different from that of the first pulse signal may be applied through a capacitor to the second node, so that a voltage applied to the source region of the first MOS transistor is output as a stepped-up voltage from the drain region of the second MOS transistor.

12. A charge pump circuit according to claim 11; wherein the first MOS transistor is formed in a first well region formed in the semiconductor substrate having a conductivity type different from that of a surrounding portion of the semiconductor substrate, the second MOS transistor is formed in a second well region formed in the semiconductor substrate having a conductivity type different from that of the semiconductor substrate, the source region of the first MOS transistor formed in the first well region is substantially same in potential as the first well region and the source region of the second MOS transistor formed in the second well region is substantially the same in potential as the second well region.

* * * * *